(12) United States Patent
Shimasaki

(10) Patent No.: US 10,492,328 B2
(45) Date of Patent: Nov. 26, 2019

(54) INFORMATION PROCESSING APPARATUS

(71) Applicant: FUJITSU LIMITED, Kawasaki-shi, Kanagawa (JP)

(72) Inventor: Akira Shimasaki, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/132,599

(22) Filed: Sep. 17, 2018

(65) Prior Publication Data

US 2019/0104638 A1 Apr. 4, 2019

(30) Foreign Application Priority Data

Sep. 29, 2017 (JP) ................................ 2017-190769

(51) Int. Cl.
*H05K 7/14* (2006.01)
*H05K 7/18* (2006.01)

(52) U.S. Cl.
CPC ......... *H05K 7/1491* (2013.01); *H05K 7/1487* (2013.01); *H05K 7/1489* (2013.01); *H05K 7/183* (2013.01)

(58) Field of Classification Search
None
See application file for complete search history.

(56) References Cited

U.S. PATENT DOCUMENTS

| 9,258,916 B2 * | 2/2016 | Lu ........................... H04Q 1/021 |
| 2009/0242233 A1 * | 10/2009 | Ueda ..................... H02G 11/006 174/135 |
| 2010/0258350 A1 * | 10/2010 | Hallett ................. H05K 7/1491 174/99 R |
| 2017/0020025 A1 * | 1/2017 | Huang ................... H05K 7/186 |
| 2017/0063064 A1 * | 3/2017 | Gintz ..................... H02G 3/305 |

FOREIGN PATENT DOCUMENTS

| JP | 58-103508 | 7/1983 |
| JP | 58-196097 | 11/1983 |
| JP | 2006-108335 | 4/2006 |

\* cited by examiner

*Primary Examiner* — Xanthia C Cunningham
(74) *Attorney, Agent, or Firm* — Fujitsu Patent Center

(57) ABSTRACT

An information processing apparatus includes a rack in which slots into each of which an assembly is removably inserted are arranged in a top-bottom direction, a cable holder that bundles cables removably attached to the assembly, using a holding portion extending in the top-bottom direction, a pair of sliders fixed to an upper part and a lower part of the cable holder, and a pair of upper and lower rails fixed to the rack and guiding the pair of sliders to slide the cable holder in a transverse direction on an opening side of the slots.

5 Claims, 18 Drawing Sheets

INFORMATION PROCESSING APPARATUS

CROSS-REFERENCE TO RELATED APPLICATION

This application is based upon and claims the benefit of priority of the prior Japanese Patent Application No. 2017-190769, filed on Sep. 29, 2017, the entire contents of which are incorporated herein by reference.

FIELD

The embodiment discussed herein is related to an information processing apparatus.

BACKGROUND

A large number of cables are used in a rack in which an electronic device such as a server is housed.

In recent years, for the purpose of improving maintenance efficiency, a rack in which an electronic device is housed employs a structure with slots provided in stages. The slots allow units of the electronic device to be removable and insertable. Further, near the slots, cables that are detachably attached to the units are generally provided. Thus, in maintenance, the unit is inserted or removed in a state where the cables removed from the unit are moved to a side of the slots.

Higher integration has been steadily progressed in a rack in which an electronic device such as a server is housed, and it is desirable that free space is reduced as much as possible in the rack in which the electronic device is housed. Thus, when cables provided to a rack are held at the space in front of slots where the cables are attached or removed, the volume of the rack may be reduced compared to a case where a space dedicated for cables is secured. It is, however, difficult to insert or remove a unit when the cables are fixed at the space in front of the slots. To cope with this, it is conceivable to provide a movable cable guide at the space in front of the slots and move the cable guide to a side of the slots when inserting or removing the unit.

In order to move the movable cable guide to a side of the slots, the cables connected to the units are pulled out in advance or the cables are installed to have long extra lengths between the unit and the cable guide. In the rack in which free space is reduced as much as possible, however, it is difficult to pull out the cables from the unit in a state where the cable guide is positioned at the space in front of the slots where the cables are attached or removed. Meanwhile, when the cable has a long extra length between the unit and the cable guide, the cable may sag down to interfere with other cables or connectors, thereby hindering the cable guide to be moved.

The followings are reference documents.
[Document 1] Japanese Laid-open Utility Model Registration Publication No. 58-103508,
[Document 2] Japanese Laid-open Patent Publication No. 58-196097, and
[Document 3] Japanese Laid-open Patent Publication No. 2006-108335.

SUMMARY

According to an aspect of the invention, an information processing apparatus includes a rack in which slots into each of which an assembly is removably inserted are arranged in a top-bottom direction, a cable holder that bundles cables removably attached to the assembly, using a holding portion extending in the top-bottom direction, a pair of sliders fixed to an upper part and a lower part of the cable holder, and a pair of upper and lower rails fixed to the rack and guiding the pair of sliders to slide the cable holder in a transverse direction on an opening side of the slots.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment is hereinafter described. The embodiment described below is merely an example, and the technical scope of the present disclosure is not limited to the embodiment.

Figure 1:
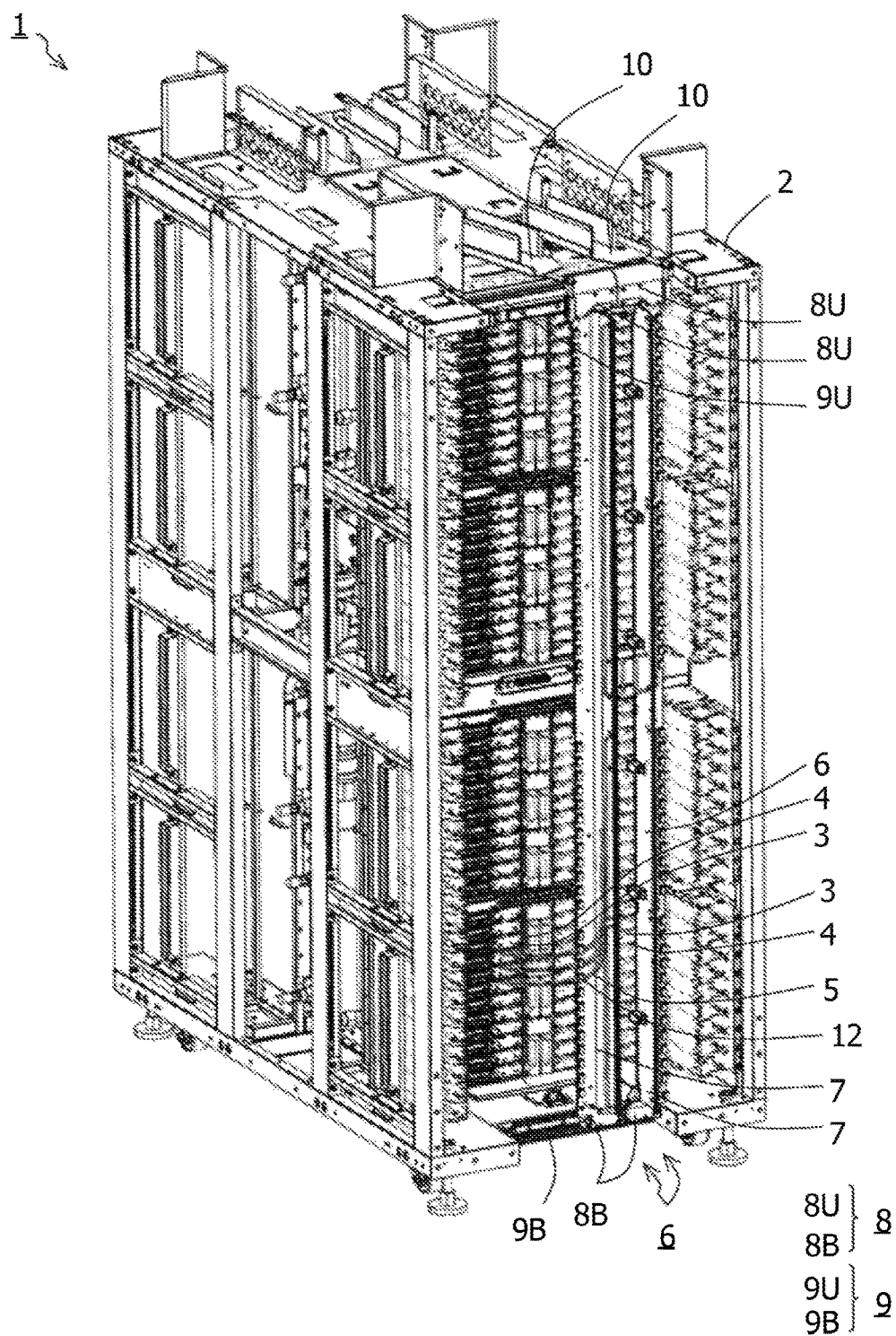
FIG. 1 is a perspective view illustrating a server according to an embodiment.

FIG. 1 is a perspective view illustrating a server 1 (an example of "information processing apparatus" in the embodiment of the present disclosure) according to the embodiment. As illustrated in FIG. 1, the server 1 includes a rack 2 in which units 3 are housed. The unit 3 has various electronic components built therein, such as a processor responsible for data processing and a memory. In the rack 2, slots 4 into or from which the units 3 are inserted or removed are arranged in a top-bottom direction.

Further, the server 1 includes cable holders 6. The cable holder 6 bundles, using a holding portion 7 extending in the top-bottom direction, cables 5 attached to or removed from the units 3. Further, the server 1 includes sliders 8 (an example of "a pair of sliders" in the embodiment of the present disclosure). The sliders 8 include an upper slider 8U that is fixed to the upper part of the cable holder 6, and a lower slider 8B that is fixed to the lower part of the cable holder 6. Further, the server 1 includes rails 9 (an example of "a pair of upper and lower rails" in the embodiment of the present disclosure). The rails 9 include an upper rail 9U that is fixed to the upper part of the rack 2 and a lower rail 9B that is fixed to the lower part of the rack 2. The rails 9 guide the slider 8 to slide the cable holder 6 in a transverse direction on the opening side of the slots 4.

For convenience of illustration, FIG. 1 illustrates a state in which the cables 5, which are attached to or removed from the units 3, are attached to some of the units 3 inserted into the respective slots 4. In the server 1, however, the cables 5 are attached to all the units 3 inserted into the respective slots 4.

Further, for convenience of illustration, FIG. 1 illustrates only the front side of the rack 2. In the rack 2, however, the slots 4 are provided in the top-bottom direction in two rows on the front side of the rack 2 and in two rows on the rear side of the rack 2. Further, the cable holders 6 and the sliders 8 are provided in two rows on the front side of the rack 2 and in two rows on the rear side of the rack 2.

Figure 2:
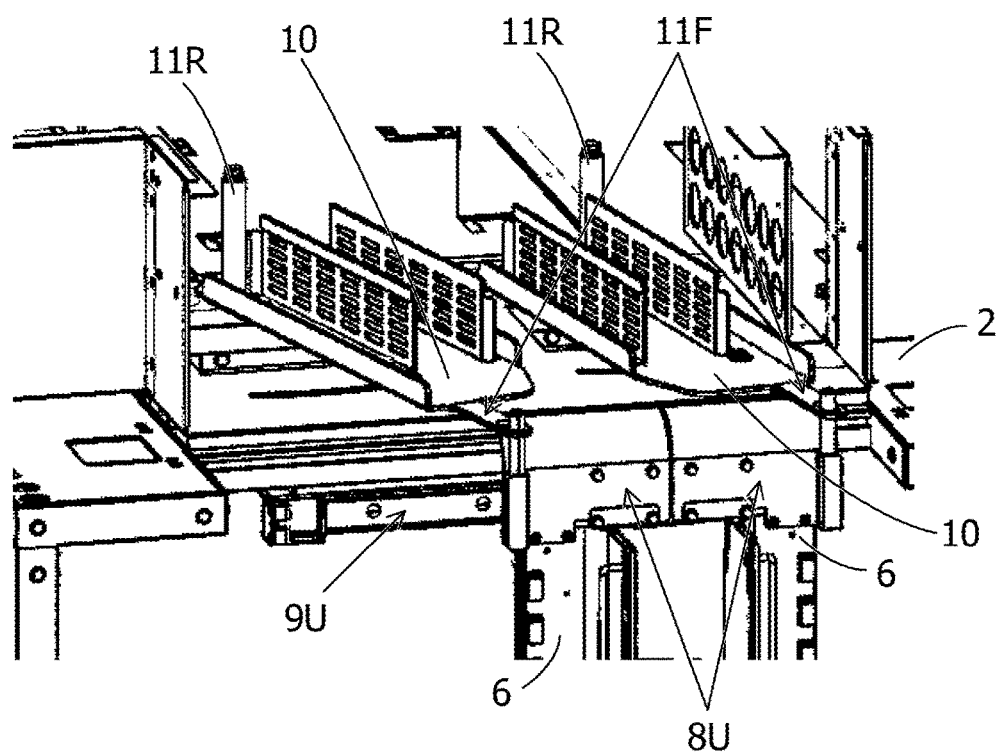
FIG. 2 is a view illustrating an upper part and its vicinity of cable holders.

FIG. 2 is a view illustrating an upper part and its vicinity of the cable holders 6. Cable trays 10 are provided at the upper part of the cable holders 6. The cable tray 10 is a tray used for drawing the cables 5 to an upper-side portion of the rack 2 from the upper part of the cable holder 6. The cable tray 10 has one end (on the far side in FIG. 2) rotatably attached to the rack 2 by a coupling portion 11R, and another end (on the front side in FIG. 2) coupled to the upper slider 8U by a coupling portion 11F.

Figure 3:
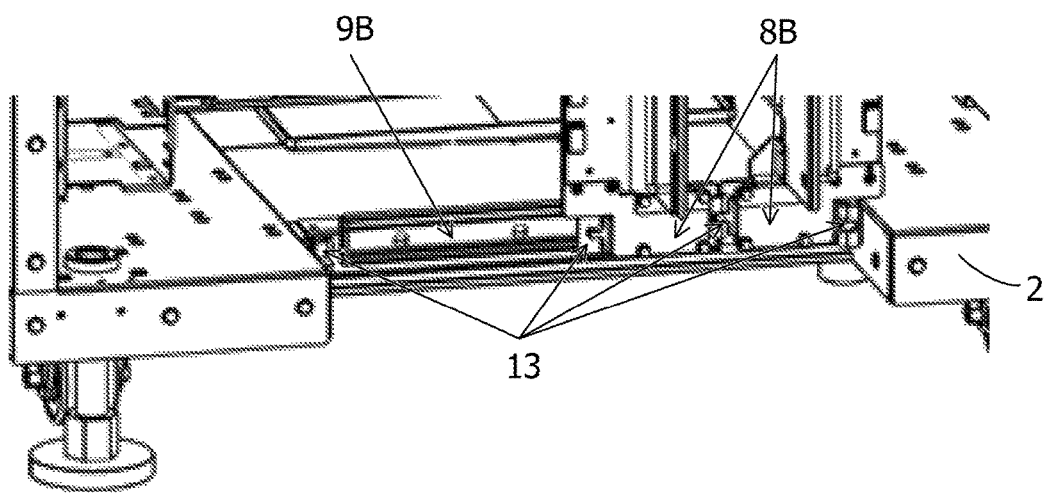
FIG. 3 is a view illustrating a lower part and its vicinity of the cable holders.

FIG. 3 is a view illustrating a lower part and its vicinity of the cable holders 6. Stoppers 13 are provided to both ends of the lower slider 8B and both ends of the lower rail 9B, which are disposed in the lower part of the cable holder 6. Each stopper 13 has a fitting structure so that adjacent stoppers 13 are fitted into each other, and functions as a stopper that stops the cable holder 6 from sliding during normal time or maintenance.

Figure 4:
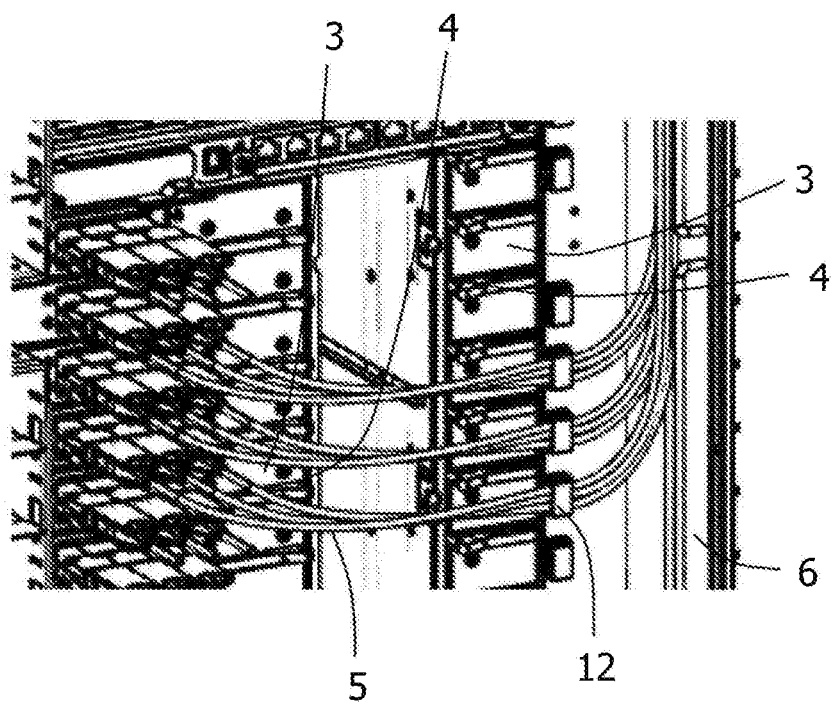
FIG. 4 is a view illustrating units.

FIG. 4 is a view illustrating the units 3. Wire holders 12 are fixed to the cable holder 6. The wire holder 12 holds the cables 5 attached to the unit 3. The wire holder 12 is fixed at a position corresponding to the opening of each slot 4, and hence the cables 5 attached to the unit 3 are formed to extend from the unit 3 toward the wire holder 12 in the transverse direction. Further, the cable holder 6 bundles the cables 5 by using the holding portion 7 extending in the top-bottom direction, and hence the cables 5 are formed to extend from the wire holder 12 in the top-bottom direction of the cable holder 6. When the cable 5 is, for example, an optical cable, the form of the cable 5 affects its transmission performance. It is thus desirable that the cable 5 is fixed to the wire holder 12 so that the forming state of the cable 5 is maintained.

Figure 5:
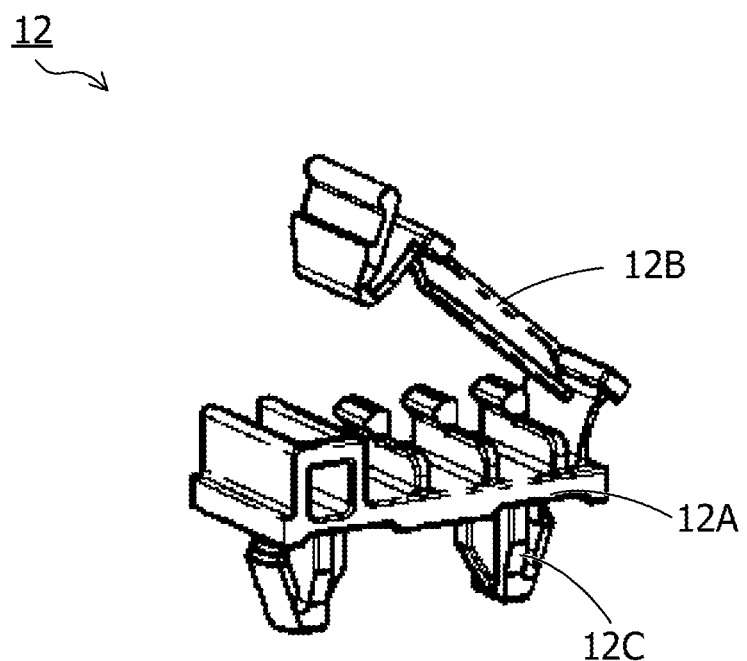
FIG. 5 is a view illustrating a wire holder.

FIG. 5 is a view illustrating the wire holder 12. As illustrated in FIG. 5, the wire holder 12 includes a holder body 12A into which the cables 5 are fitted, a holder cover 12B that keeps the cables 5 fitted into the holder body 12A without dropping off, and an anchor 12C for fixing the holder body 12A to the cable holder 6. The wire holder 12 has a function of keeping the cables 5 from sagging down due to the extra lengths when the unit 3 is inserted or removed, and hence a unit 3 is inserted or removed in a state where the cables 5 attached to units 3 that are not to be inserted and removed are held by the wire holders 12 with the holder covers 12B closed.

In the above-mentioned server 1, each part moves as described below.

Figure 6:
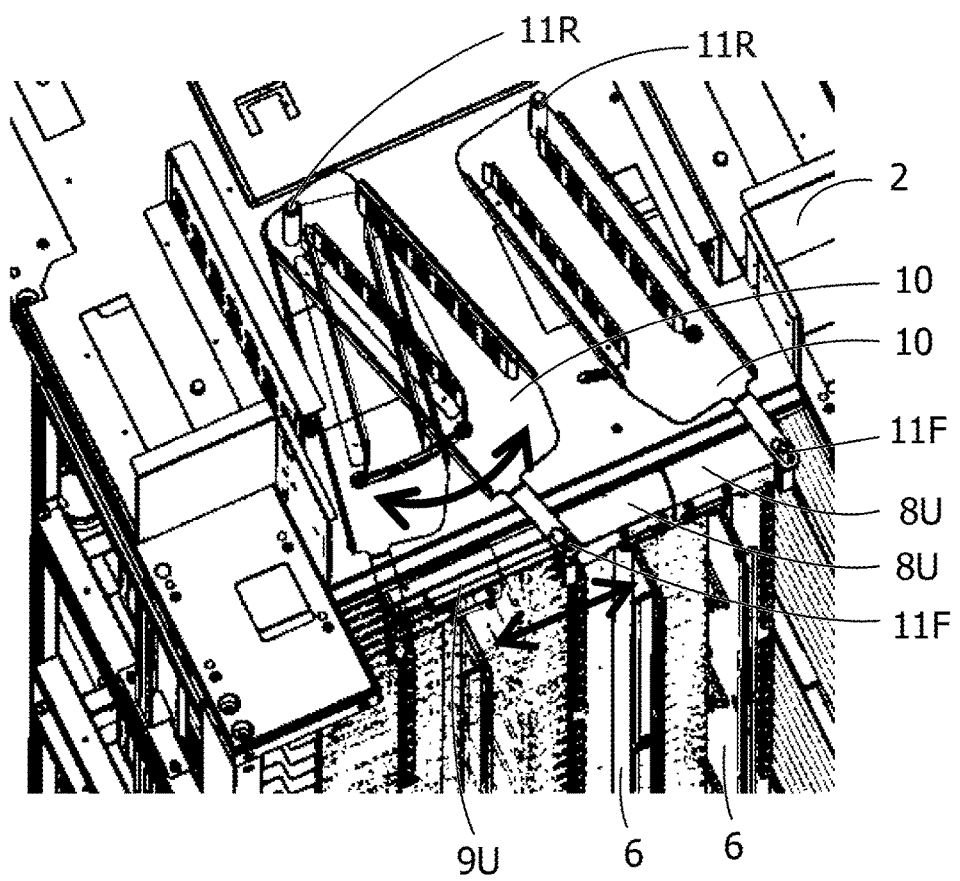
FIG. 6 is a view illustrating movement of a cable tray.

FIG. 6 is a view illustrating movement of the cable tray 10. The cable tray 10 provided at the upper part of the cable holder 6 has one end rotatably attached to the rack 2 by the coupling portion 11R, and another end coupled to the upper slider 8U by the coupling portion 11F. Thus, when the upper slider 8U is slid transversely, the cable tray 10 rotates about the coupling portion 11R along with movement of the upper slider 8U.

Figure 7:
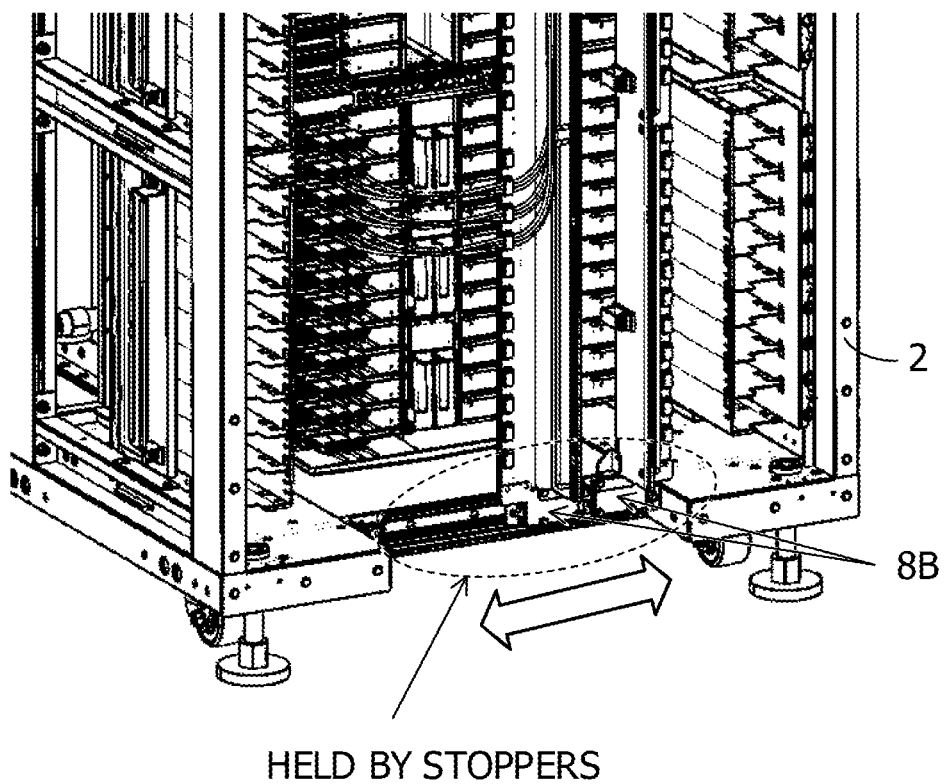
FIG. 7 is a view illustrating stoppers.

FIG. 7 is a view illustrating the stoppers 13. The stoppers 13 are provided to both the ends of the lower slider 8B and both the ends of the lower rail 9B, which are present in the lower part of the cable holder 6. Each stopper 13 has the fitting structure so that adjacent stoppers 13 are fitted into each other, and functions as the stopper that stops the cable holder 6 from sliding. Thus, for example, when the cable holder 6 is slid to the left, the stopper 13 provided to the lower slider 8B and the stopper 13 provided to the left end of the lower rail 9B are fitted into each other, and the cable holder 6 is held on the left side. Further, for example, when the cable holder 6 is slid to the right, the stopper 13 provided to the lower slider 8B and the stopper 13 provided to the right end of the lower rail 9B are fitted into each other, and the cable holder 6 is held on the right side.

Figure 8:
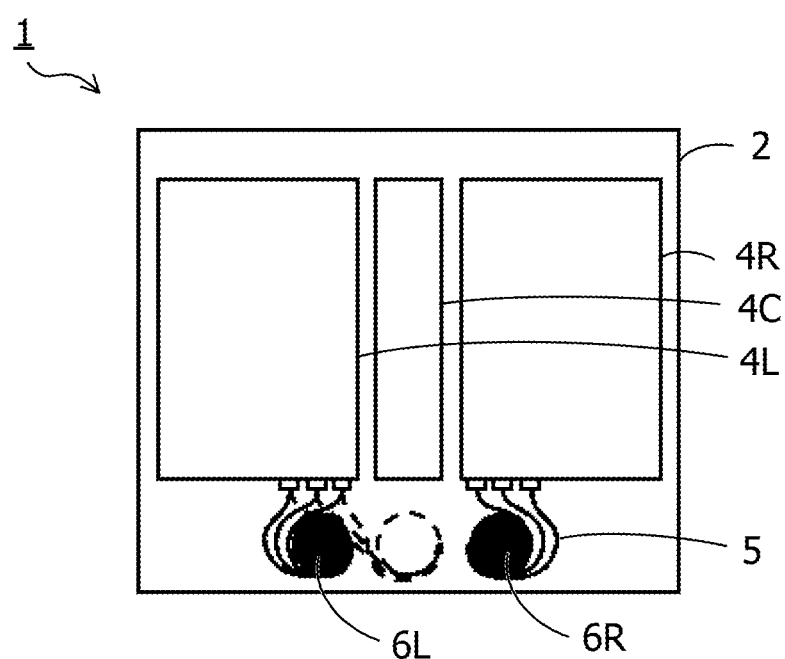
FIG. 8 is a first diagram illustrating a state of the server.

FIG. 8 is a first diagram illustrating a state of the server 1. For example, the slots 4, into or from which the units 3 are inserted or removed, are provided as a slot 4L and a slot 4R in a left row and a right row, respectively, and a slot 4C, into or from which an electronic device smaller than the unit 3 is inserted or removed, is provided between the slot 4L and the slot 4R. Further, the cable holder 6 that bundles the cables 5 connected to the unit 3 that is inserted into or removed from the slot 4L is provided as a cable holder 6L, and the cable holder 6 that bundles the cables 5 connected to the unit 3 that is inserted into or removed from the slot 4R is provided as a cable holder 6R. In the rack 2 including the slots 4L, 4C, and 4R, the server 1 is generally used in a state where the cable holder 6L is positioned in front of the slot 4L and the cable holder 6R is positioned in front of the slot 4R.

Figure 9:
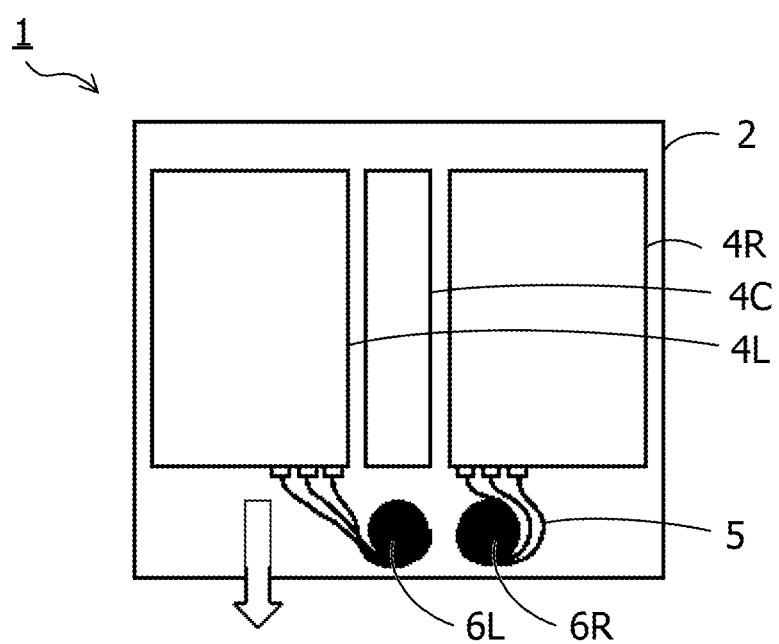
FIG. 9 is a second diagram illustrating a state of the server.

FIG. 9 is a second diagram illustrating a state of the server 1. For example, when the unit 3 is inserted into or removed from the slot 4L, the cable holder 6L is slid to the right. When the cable holder 6L is slid to the right, no obstacle is present in front of the slot 4L, which allows a worker to touch the cables 5 attached to the unit 3. As a result, the worker may attach or remove the cables 5 to or from the unit 3 in the slot 4L or insert or remove the unit 3 into or from the slot 4L. When the unit 3 is inserted into or removed from the slot 4R, the cable holder 6R is slid to the left. When the cable holder 6R is slid to the left, no obstacle is present in front of the slot 4R, which allows the worker to touch the cables 5 attached to the unit 3. As a result, the worker may attach or remove the cables 5 to or from the unit 3 in the slot 4R or insert or remove the unit 3 into or from the slot 4R.

Figure 10:
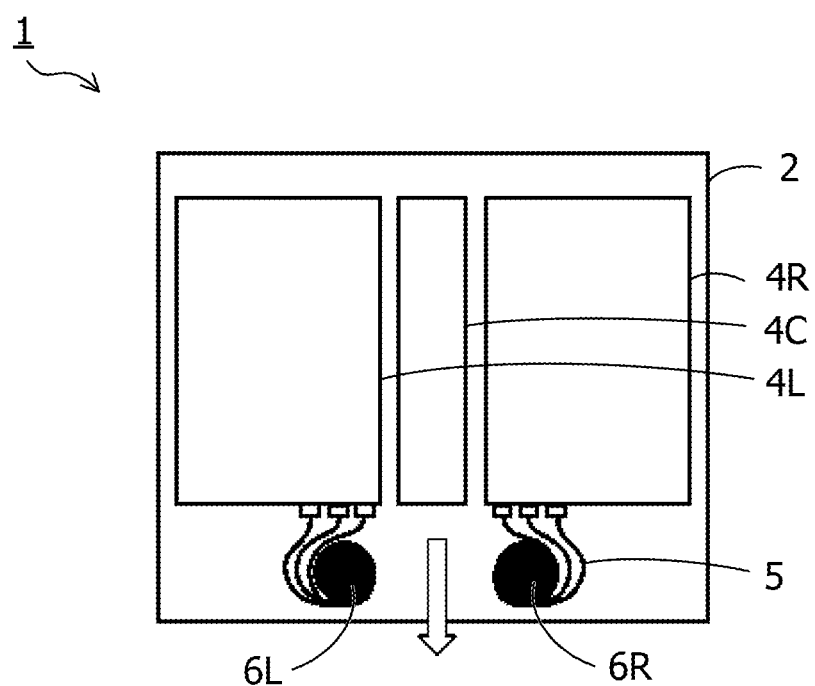
FIG. 10 is a third diagram illustrating a state of the server.

FIG. 10 is a third diagram illustrating a state of the server 1. For example, when the unit is inserted into or removed from the slot 4C, the cable holder 6L is slid to the left and the cable holder 6R is slid to the right. When the cable holder 6L is slid to the left and the cable holder 6R is slid to the right, no obstacle is present in front of the slot 4C, and hence the unit may be inserted into or removed from the slot 4C.

Figure 11:
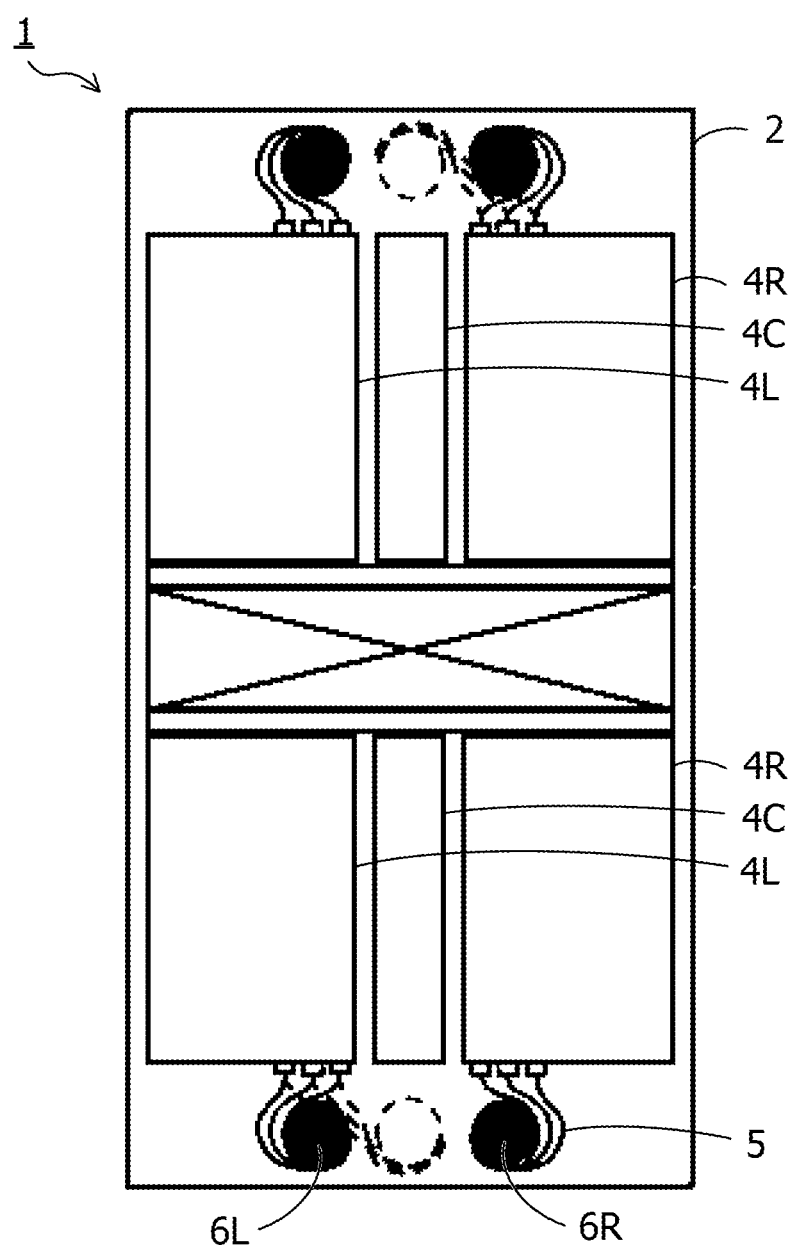
FIG. 11 is a fourth diagram illustrating a state of the server.

FIG. 11 is a fourth diagram illustrating a state of the server 1. In FIG. 8 to FIG. 10, the slots 4L, 4C, and 4R provided on one of the front and rear sides of the rack 2 are only illustrated, but the slots 4L, 4C, and 4R on the other side are similar to the slots 4L, 4C, and 4R on the one side. That is, on either of the front and rear sides of the rack 2, the cable holder 6L or 6R is slid to an appropriate location when the unit 3 is inserted into or removed from the slot 4L or 4R, or the unit is inserted into or removed from the slot 4C.

Figure 12:
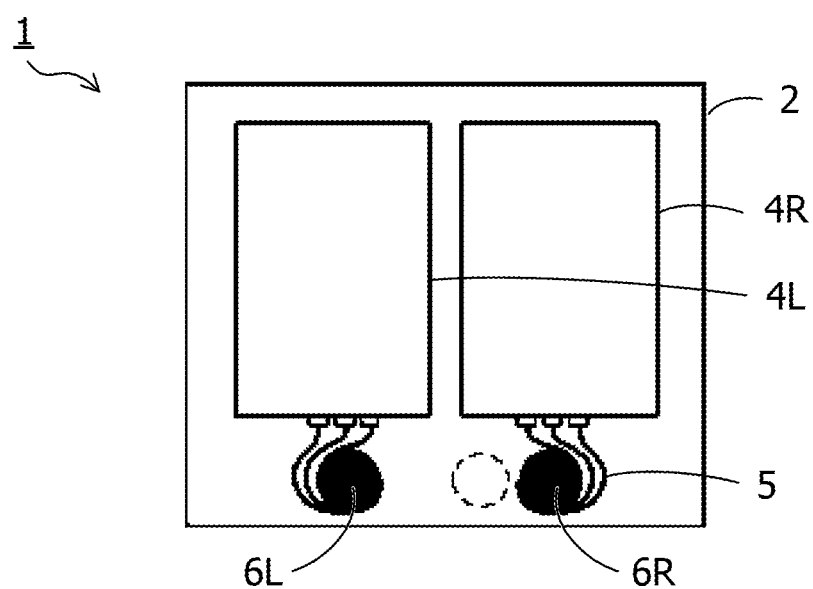
FIG. 12 is a fifth diagram illustrating a state of the server.

FIG. 12 is a fifth diagram illustrating a state of the server 1. In FIG. 8 to FIG. 11, the slot 4C is provided to the server 1, but the slot 4C may be omitted as illustrated in FIG. 12. In the server 1 in which the slot 4C is omitted, for example, when the unit 3 is inserted into or removed from the slot 4L, the cable holder 6L is slid to the right to be positioned in front of the slot 4R. When the cable holder 6L is positioned in front of the slot 4R, no obstacle is present in front of the slot 4L, and hence the unit 3 may be inserted into or removed from the slot 4L. Further, for example, when the unit 3 is inserted into or removed from the slot 4R, the cable holder 6R is slid to the left to be positioned in front of the slot 4L. When the cable holder 6R is positioned in front of the slot 4L, no obstacle is present in front of the slot 4R, and hence the unit 3 may be inserted into or removed from the slot 4R.

Figure 13:
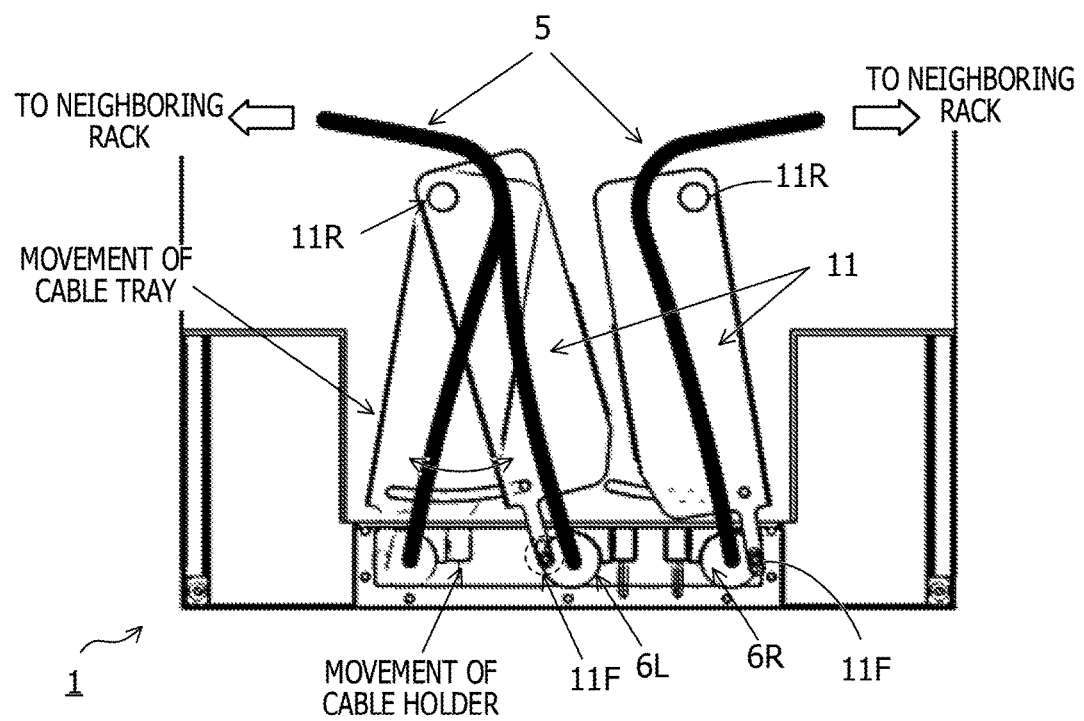
FIG. 13 is a diagram illustrating how cables move on the cable tray when a cable holder is slid.

FIG. 13 is a diagram illustrating how the cables 5 move on the cable tray 10 when the cable holder 6L or 6R is slid. The cable tray 10 provided at the upper part of the cable holder 6 has one end rotatably attached to the rack 2 by the coupling portion 11R, and the other end coupled to the upper slider 8U by the coupling portion 11F. Further, the cables 5 supported on the cable tray 10 are routed near the coupling portion 11F toward the cable holder 6L or 6R and are routed near the coupling portion 11R to a neighboring rack 2 or the ceiling. Thus, the cables 5 follow movement of the cable tray 10, which moves along with slide of the cable holder 6L or 6R, and turn about the vicinity of the coupling portion 11R at the upper part of the rack 2. That is, the cables 5 move by following movement of the cable tray 10, and hence the worker may slide the cable holder 6L or 6R without applying tension on the cables 5. The cables 5 routed to the lower part of the cable holder 6L or 6R are also routed to the neighboring rack 2 or the ceiling, similarly to the cables 5 routed to the upper part of the cable holder 6L or 6R.

In order to smoothly slide the cable holders 6L and 6R without applying tension on the cables 5, the server 1 is preferably manufactured so that the cable tray 10 has a rotation angle of about 30 degrees or less. For example, when the length of the cable tray 10 is 40 cm and the slide amount of the cable holders 6L and 6R is about 18 cm, the rotation angle of the cable tray 10 is about 25 degrees. When the server 1 is manufactured with such dimensions, the cable 5 formed to have an appropriate length bends by at most about 2 cm even when the cable holder 6L or 6R is slid.

The effects that the server 1 provides were verified, and the results of verification are hereinafter described.

Figure 14:
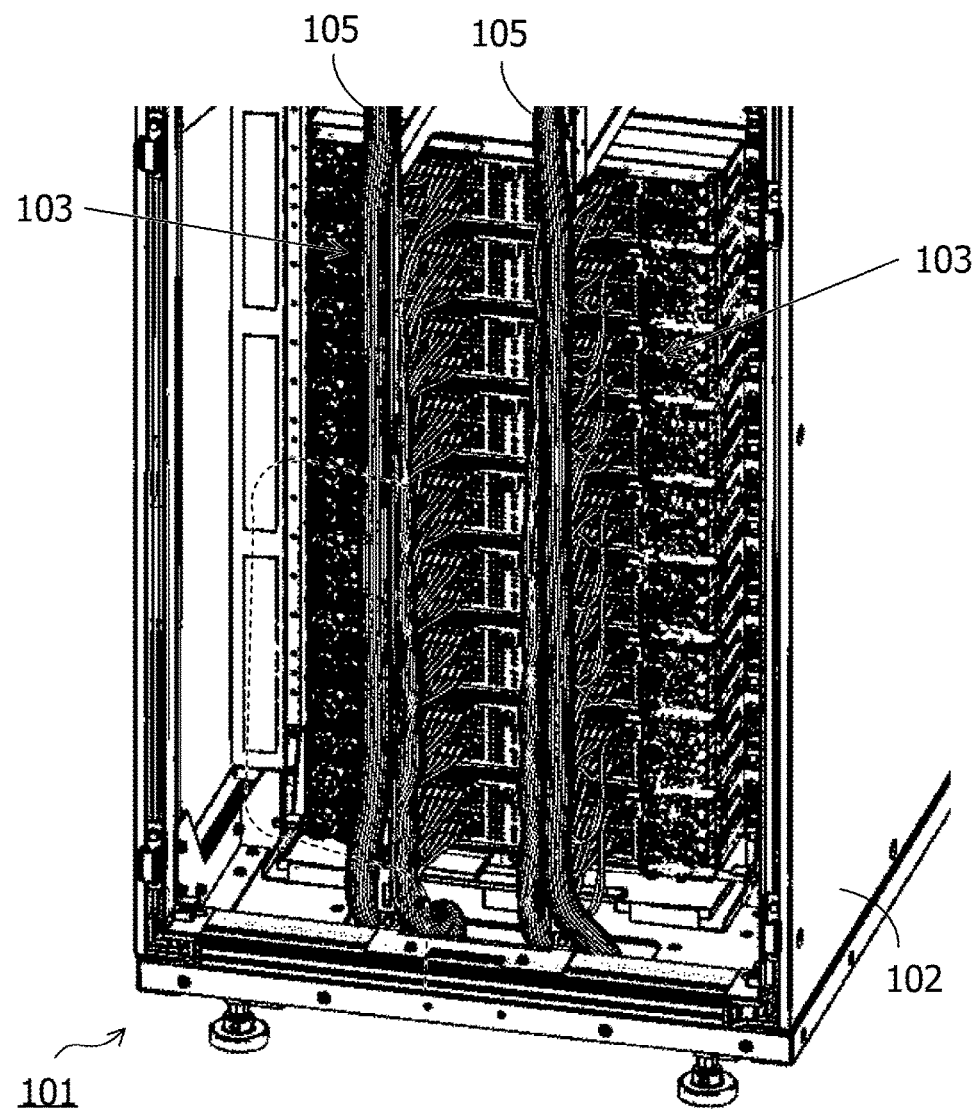
FIG. 14 is a view illustrating a server according to a first comparative example.

FIG. 14 is a view illustrating a server 101 according to a first comparative example. The server 101 of the first comparative example, which is used in the verification, includes a rack 102 in which units 103 are housed as illustrated in FIG. 14. Further, the server 101 includes cables 105 bundled in front of the units 103. In the rack 102, the cables 105 attached to the respective units 103 arranged in the top-bottom direction are bundled in front of the units 103 while extending in a longitudinal direction. Thus, the unit 103 is inserted or removed as described below.

Figure 15:
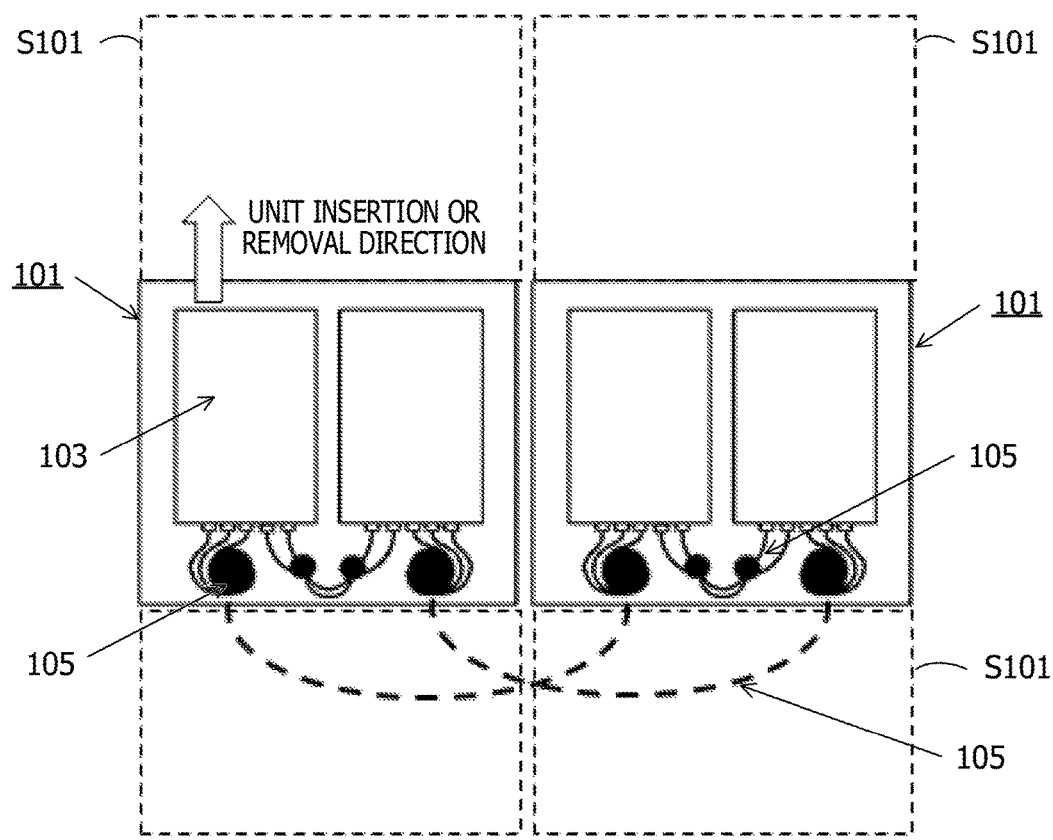
FIG. 15 is a diagram illustrating how a unit is inserted or removed in the server according to the first comparative example.

FIG. 15 is a diagram illustrating how the unit 103 is inserted or removed in the server 101 according to the first comparative example. In the server 101, the cables 105 are bundled in front of the units 103, and hence it is difficult to pull out the unit 103 toward the cables 105. In the server 101, the unit 103 is accordingly pulled out to the side opposite to the cables 105 as illustrated in FIG. 15. As a result, in the server 101 of the first comparative example, a work space S101 used for attaching or removing the cables 105 to or from the units 103, and a work space S101 used for inserting or removing the units 103 have to be secured in front of and behind the rack 102.

Figure 16:
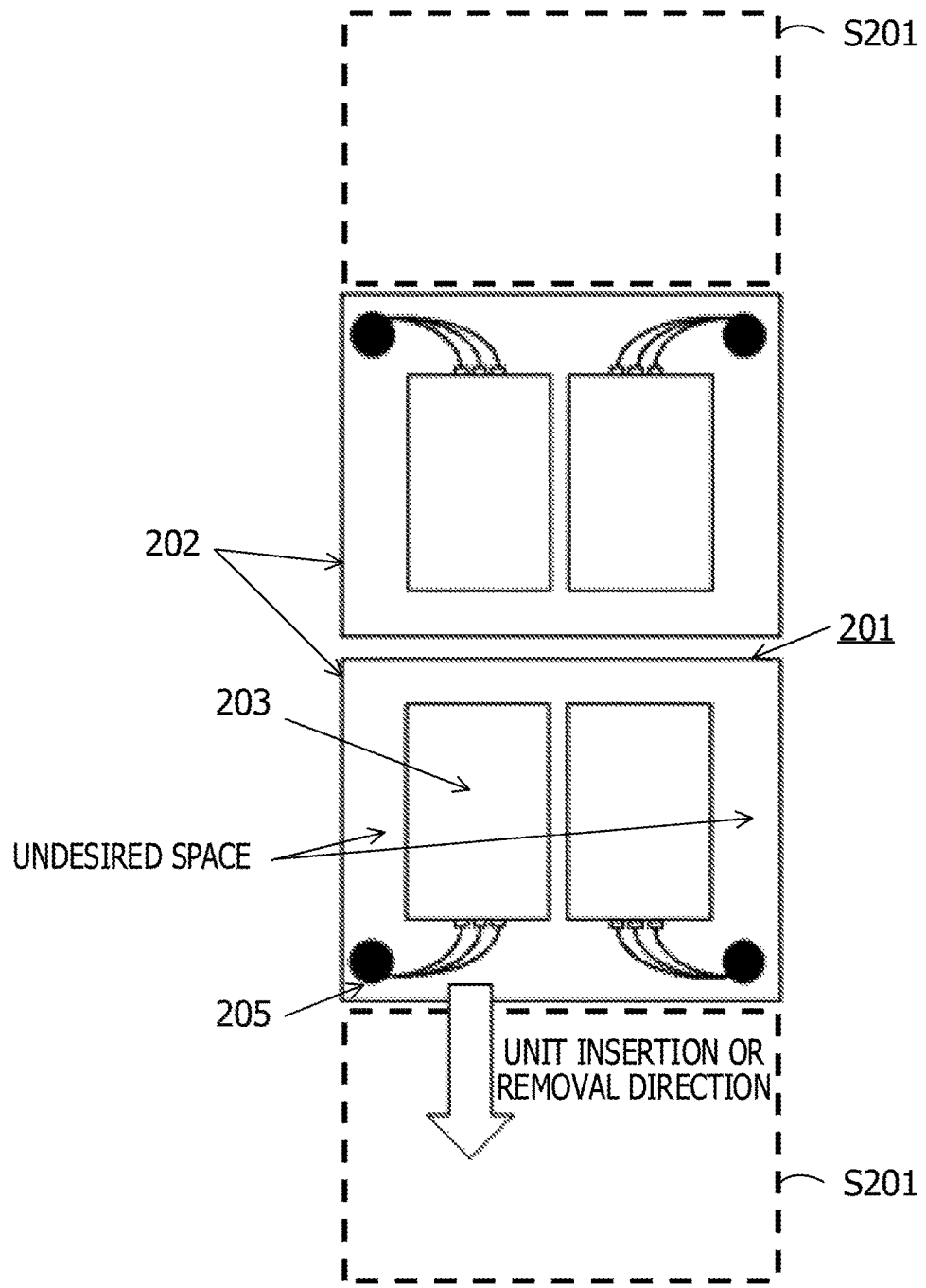
FIG. 16 is a diagram illustrating a server according to a second comparative example.

FIG. 16 is a diagram illustrating a server 201 according to a second comparative example. In the server 201 of the second comparative example used in the verification, in order to allow units 203 housed in a rack 202 to be pulled out from the side of cables 205, the cables 205 are bundled at the sides of the units 203 instead of in front of the units 203 in the rack 202. Thus, in the server 201, the unit 203 may be pulled out to the side of the cables 205 as illustrated in FIG. 16. As a result, in the server 201 of the second comparative example, it is enough that only a work space S201 is secured in front of the rack 202. The work space S201 doubles as a work space used for attaching or removing the cables 205 to or from the units 203 and a work space used for inserting or removing the units 203. That is, in the server 201 according to the second comparative example, the two work spaces S101 and S101 do not have to be secured in front of and behind the rack 102, unlike the server 101 according to the first comparative example. In the server 201, however, the cables 205 are bundled at the sides of the units 203 in the rack 202, and hence undesired spaces are inevitably formed at the sides of the units 203 in the rack 202 as illustrated in FIG. 16.

Figure 17:
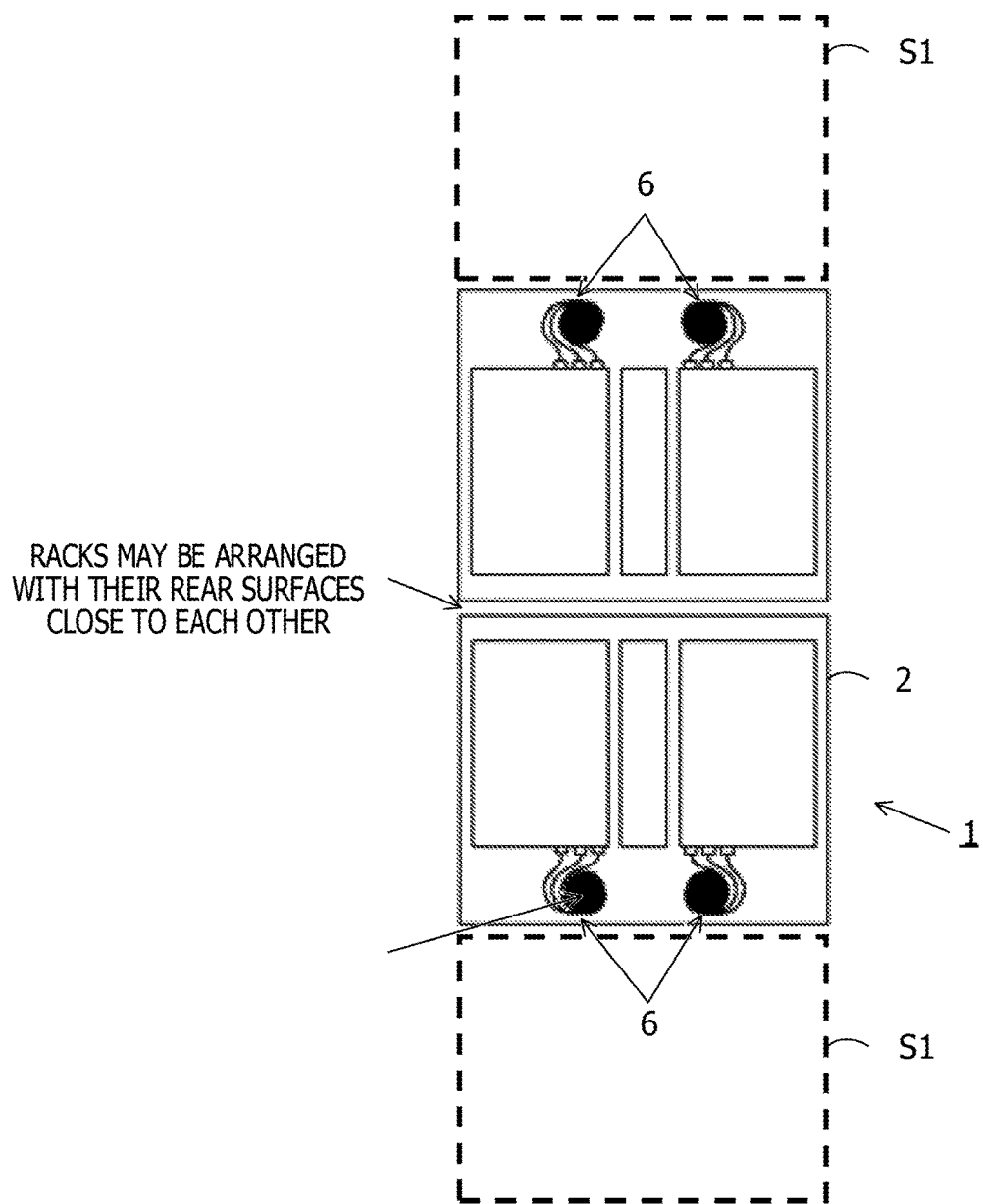
FIG. 17 is a diagram illustrating the server according to the embodiment.

FIG. 17 is a diagram illustrating the server 1 according to the embodiment. In the server 101 according to the first comparative example, the work spaces S101 are secured in front of and behind the rack 102. In the server 1 according to the embodiment, on the other hand, as illustrated in FIG. 17, it is enough that a work space S1 is secured on the front side of the rack 2, and the racks 2 may be arranged so that their rear surfaces are close to each other. Further, in the server 201 according to the second comparative example, the undesired spaces are formed in the rack 202. In the server 1 according to the embodiment, on the other hand, as illustrated in FIG. 17, there is no undesired space in the rack 2 except for the space that is used for attaching or removing the cables 5 and may double as a space for the cable holder 6 to be slid. A rack occupancy of the server 1 according to the embodiment may therefore be reduced as described below, compared to the server 101 of the first comparative example and the server 201 of the second comparative example.

Figure 18:
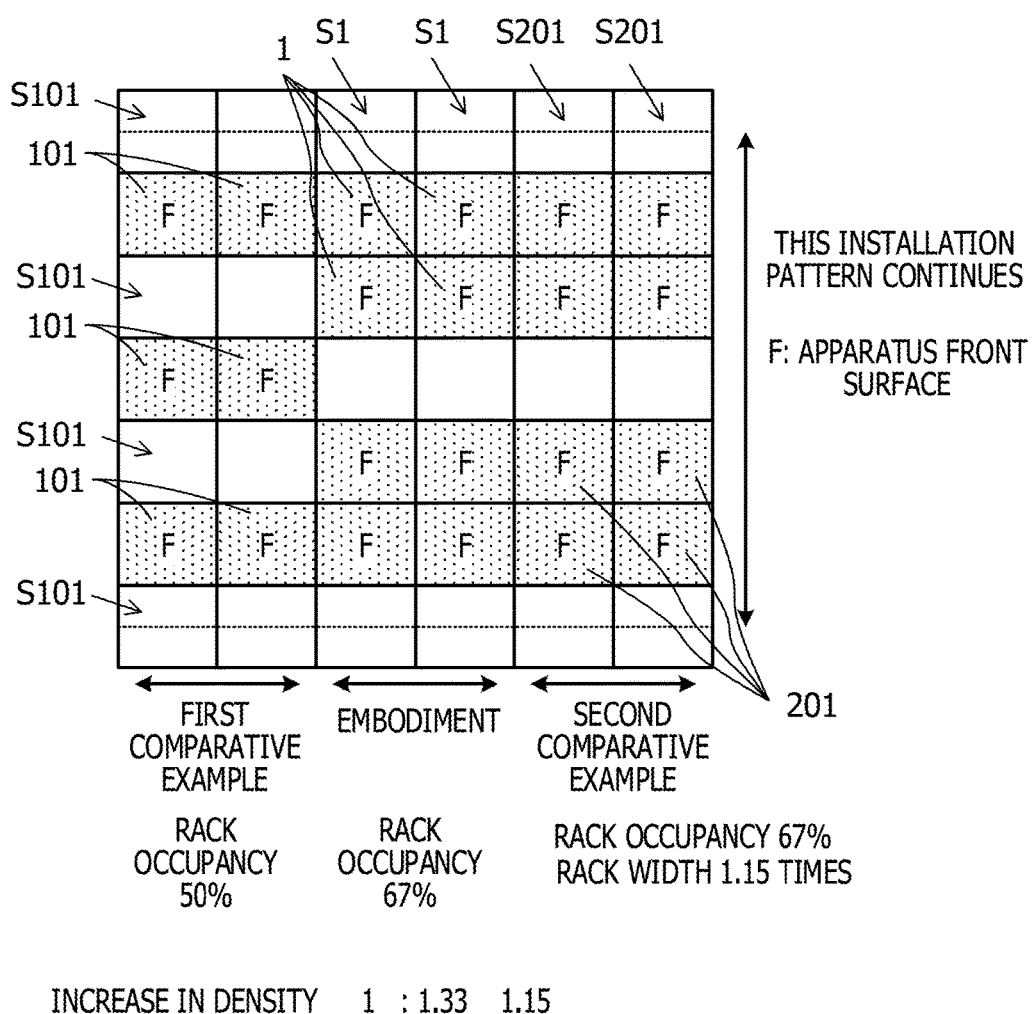
FIG. 18 is a diagram visually illustrating rack occupancy of each server.

FIG. 18 is a diagram visually illustrating a rack occupancy of each of the servers 1, 101, and 201. When servers 101 of the first comparative example are installed, the servers 101 are aligned so that the work spaces S101 are secured in front of and behind the rack 102 as illustrated in FIG. 18, for example. When the area of each work space S101 is equal to the occupied area of the server 101, the servers 101 occupy 50% of the whole installation space. The installation density of the servers 101 in this case is defined as 1.

When servers 201 of the second comparative example are installed, the servers 201 are aligned so that their rear surfaces are close to each other as illustrated in FIG. 18, for example. Thus, when the area of each work space S201 is equal to the occupied area of the server 201, the servers 201 occupy 67% of the whole installation space. The width of the server 201 is, however, 1.15 times as large as that of the server 101 due to the undesired spaces in the rack 202. Thus, the installation density of the servers 201 in this case is 1.15.

Meanwhile, when servers 1 of the embodiment are installed, the servers 1 are aligned so that their rear surfaces are close to each other as illustrated in FIG. 18, for example. Thus, when the area of each work space S1 is equal to the occupied area of the server 1, the servers 1 occupy 67% of the whole installation space. Further, the width of the server 1 is equal to that of the server 101. Thus, the installation density of the servers 1 in this case is 1.33.

As is apparent from the verification results, because a space dedicated to cables is not included in the rack 2, the server 1 of the embodiment may achieve higher installation density than the servers 101 and 201 of the comparative examples do through a reduction in space inside and outside the rack 2, while allowing the units 3 to be inserted or removed from the side of the cables 5. As a result, with the server 1 of the embodiment, the servers may be laid out at high density as the whole system while the maintenance workability is maintained.

In the above-mentioned server 1 of the embodiment, the two cable holders 6L and 6R corresponding to the slots 4L and 4R in the two rows are attached to the rail 9. However, when one of the slots 4L and 4R is omitted, for example, one cable holder may be attached to the rail 9. Further, when the slots are provided in three or more rows, three or more cable holders may be attached to the rail 9.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. An information processing apparatus comprising:
   a rack that includes a plurality of slots arranged in a first direction from a bottom surface of the rack to a top surface of the rack to removably insert the plurality of electronic devices;
   a cable holder provided to extend along the first direction and configured to guide a plurality of cables removably attached to one of the plurality of electronic devices to the top surface of the rack;
   a pair of sliders fixed to an upper part and a lower part of the cable holder; and
   a pair of upper and lower rails respectively provided along an edge of the top surface and an edge of the bottom surface of the rack and configured to move the cable holder by sliding the pair of sliders along a second direction perpendicular to the first direction.

2. The information processing apparatus according to claim 1, further comprising:
   a cable tray that has one end rotatably attached to the rack, and another end moving along with movement of the pair of sliders.

3. The information processing apparatus according to claim 1, further comprising:
   a wire holder fixed at a position corresponding to an opening of one of the plurality of slots,
   wherein the plurality of cables are formed to extend from the one of the plurality of electronic devices toward the wire holder in the second direction and formed to extend from the wire holder toward the top surface of the rack in the first direction.

4. The information processing apparatus according to claim 1, wherein
   the slots are arranged in rows in the top-bottom direction in the rack, and
   a number of the cable holders and a number of the pair of sliders each correspond to a number of the rows.

5. The information processing apparatus according to claim 1, wherein
   a first slider of the pair of sliders is configured to slide toward the second direction, and
   a second slider of the pair of sliders is configured to slide toward a direction which is different from the second direction.

\* \* \* \* \*